United States Patent [19]

Schmidt et al.

[11] Patent Number: 5,047,628

[45] Date of Patent: Sep. 10, 1991

[54] HYBRID SWITCH WITH SOLID-STATE CONDITION

[75] Inventors: Ronald Schmidt, Arlington Hts.; Roy Robertson; John C. Jones, both of Chicago, all of Ill.

[73] Assignee: Illinois Tool Works Inc., Glenview, Ill.

[21] Appl. No.: 498,968

[22] Filed: Mar. 26, 1990

[51] Int. Cl.$^5$ .............................................. G01D 5/34
[52] U.S. Cl. ..................................... 250/229; 200/447
[58] Field of Search ................ 250/229; 200/462, 465, 200/447

[56] References Cited

U.S. PATENT DOCUMENTS

| | | | |
|---|---|---|---|
| 3,624,332 | 11/1971 | Van Benschoten et al. | 200/447 |
| 4,649,272 | 3/1987 | Lipschutz | 250/229 |
| 4,894,530 | 1/1990 | Kitchen | 250/229 |
| 4,943,715 | 7/1990 | Konishi | 250/229 |

Primary Examiner—David C. Nelms
Assistant Examiner—Khaled Shami
Attorney, Agent, or Firm—Schwartz & Weinrieb

[57] ABSTRACT

A hybrid switch includes a snap-action switching portion having a butterfly-type mechanism and a solid-state switching portion formed within a single, compact housing. The solid-state switching portion is formed of an electro-electronic device consisting of a light-emitting diode and a phototransistor. Alternatively, the solid-state switching portion is formed of a bipolar transistor.

21 Claims, 2 Drawing Sheets

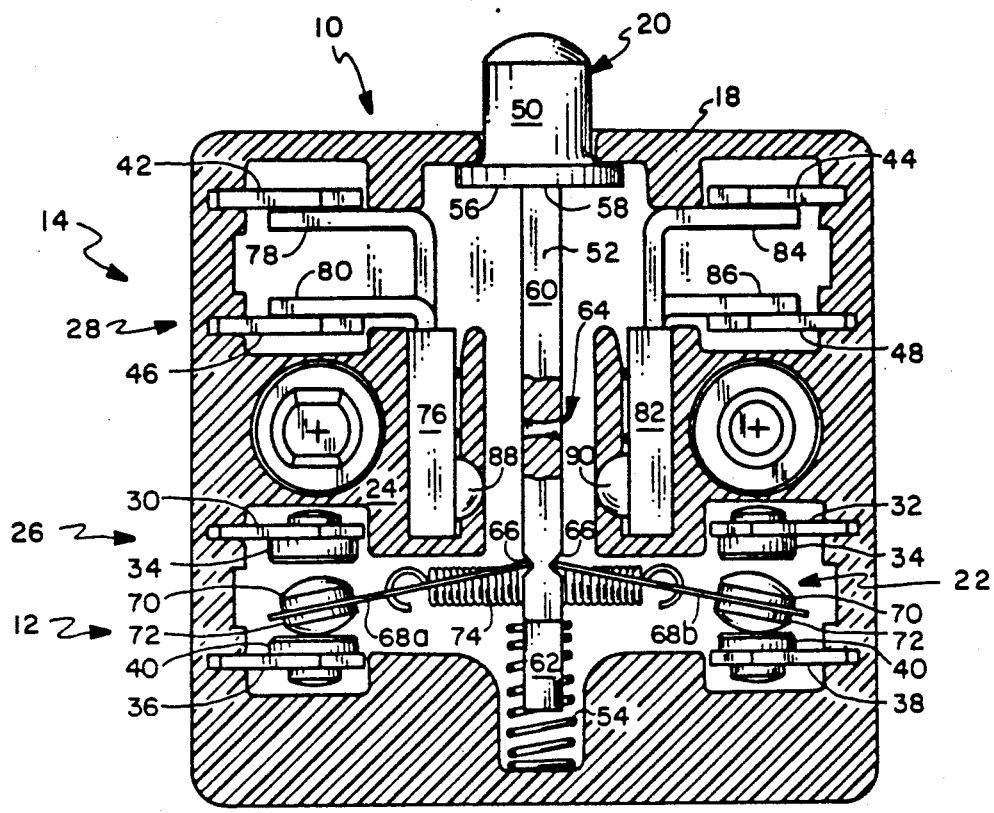

HYBRID SWITCH WITH SOLID-STATE CONDITION

FIELD OF THE INVENTION

This invention relates generally to compact electrical switches and more particularly, it relates to a hybrid switch which combines a snap-action switch having a butterfly-type mechanism and a solid-state switch into a single compact housing.

BACKGROUND OF THE INVENTION

Generally, snap-action switches of the butterfly-type are well-known in the prior art. Such a prior art snap switch is illustrated and described in U.S. Pat. No. 3,612,793 issued on Oct. 12, 1971, to John O. Roeser and entitled "Electrical Switch Components And Switches Formed Thereby," which is hereby incorporated by reference. As can be seen from FIGS. 1-14 of the '793 patent, there is shown a two circuit snap switch mechanism 10 which is comprised of a support means 12, movable actuation means 14, combination switchblade and contact means 16, terminal means 18, and sealing means 20. In operation, when the button 72 of the actuation means 14 is depressed the elongated member 74 is caused to move downwardly against the bias of the return springs 76 and 78. The combination switchblade and contact means 16 is initially restrained by means of the lower fixed contact portions 156 so that the lower contact portions 130 of the movable contact members 109a, 109b remain in contact therewith.

This contact engagement continues until the pivot points 106 pass the center line of the tension spring 120. At that time, the movable contact members 109a, 109b will snap overcenter and the upper contact portions 130 thereof will become engaged with the upper fixed contacts 148. This engagement continues until the pressure upon the top of the button 72 is released, thereby causing the return springs 76 and 78 to return the elongated member 74 and the button 72 to their original rest position. As the elongated member 74 returns past the center line of the tension spring 120, the movable contact members 109a, 109b will snap overcenter again in the reverse direction. In this manner, there has been provided a snap-action switch which produces closing and opening of mechanical contacts through means of physical movement thereof for making and breaking a circuit.

Furthermore, there is also heretofore known in the prior art electronic components which are capable of providing selective connecting and disconnecting of circuits by solid-state means without the need of physical movement of mechanical contacts. However, these solid-state type of switches have been formed as separate units within their own casing.

In certain applications such as, for examples in the aerospace industry, there has arisen a need for switches which can provide both a mechanical type of switching and a solid-state type of switching. The mechanical contacts are able to handle higher power applications while the solid-state type switches handle a relatively low level of power but exhibit high reliability. It would be desirable to provide a novel and improved hybrid switch which combines a snap-action switch of the butterfly-type and a solid-state type switch into a single compact housing.

OBJECTS OF THE INVENTION

Accordingly, it is a general object to the present invention to provide a novel and improved hybrid switch which is relatively simple and economical to manufacture and assemble, but has been traditionally unavailable.

It is an object of the present invention to provide a hybrid switch which combines a snap-action switch having a butterfly-type mechanism and a solid-state switch into a single compact housing.

It is another object of the present invention to provide a hybrid switch which includes a snap-action switch portion and a solid-state switch portion both formed within a single compact housing.

It is still another object of the present invention to provide a hybrid switch which includes a snap-action switch portion and a solid-state switch portion formed of a light-emitting diode and a phototransistor.

It is yet still another object of the present invention to provide a hybrid switch which includes a snap-action switch portion and a solid-state switch portion formed of a bipolar transistor.

SUMMARY OF THE INVENTION

In accordance with these aims and objectives, the present invention is concerned with the provision of a compact solid-state/mechanical hybrid switch, which includes a housing, an actuating member, a return spring, a switch butterfly assembly, first terminal members, a solid-state switching portion, and second terminal members. The actuating member is disposed within the housing for movement downwardly from a first position to a second position. The return spring is also disposed within the housing and is operatively connected to the actuating member for returning the actuating member from the second position to the first position when pressure is released upon the actuating member. The switch butterfly assembly is disposed within the housing and includes a pair of opposed movable switch contact blade members pivotally mounted upon the actuating member.

The first terminal members are disposed within the housing and include a pair of opposed upper fixed contact members and a pair of opposed lower fixed contact members. The solid-state switching portion is disposed within the housing for producing a selective switching of low and high logic levels at the second terminal members. The second terminal members are disposed within the housing and include an output contact terminal.

In accordance with one embodiment of the present invention, the solid-state switching portion is comprised of a light-emitting diode and a phototransistor. In accordance with another embodiment of the present invention, the solid-state switching portion is formed of a bipolar transistor.

BRIEF DESCRIPTION OF THE DRAWINGS

These and other objects and advantages of the present invention will become more fully apparent from the following detailed description when read in conjunction, in which the accompanying drawings with like reference numerals indicate corresponding parts throughout the several views wherein:

FIG. 1 is an enlarged, cross-sectional view of a hybrid switch, constructed in accordance with the principles of the present invention;

FIG. 2 is a schematic circuit diagram of the hybrid switch of FIG. 1, illustrating its connection to external components during use;

FIG. 3 is a wiring diagram for FIG. 2, illustrating the connection of the terminal contact members of the hybrid switch of FIG. 1 to the external components;

DESCRIPTION OF THE PREFERRED EMBODIMENTS

Figure 4:
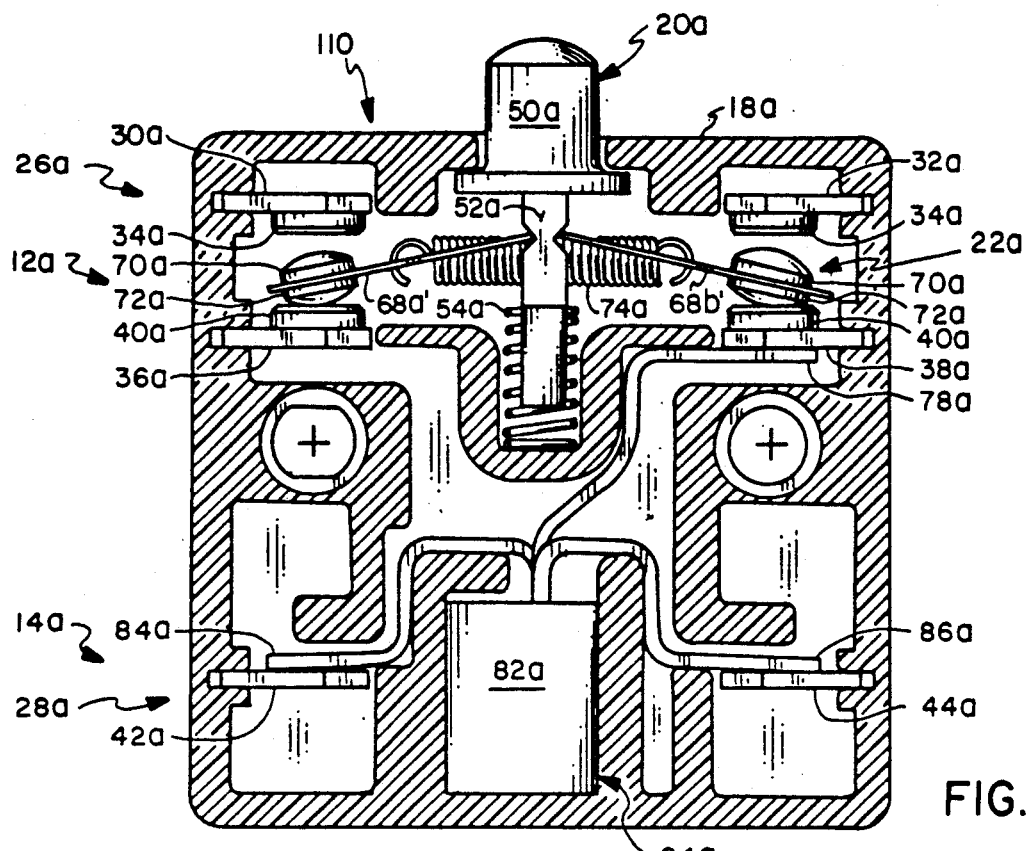
FIG. 4 is an enlarged, cross-sectional view of a second embodiment of a hybrid switch, constructed in accordance with the principles of the present invention.

Referring now in detail to the drawings, there is shown in FIG. 1 a hybrid switch 10 of the present invention which is of the two-pole, double-throw type (two circuit switch) and which houses a snap-action switch portion 12 having electro-mechanical contacts forming a first one of the two poles and a solid-state switch portion 14 having electronic means for forming the second one of the two poles.

The snap-action switch portion 12 and the solid-state switch portion 14 are both mounted within the interior space of a single, compact housing which has been traditionally unavailable. The hybrid switch 10 is comprised of an outer protective switch casing 18, button and spring actuator assembly 20, snap-action switch butterfly assembly 22, electronic switching means 24, first terminal means 26, and second terminal means 28. The snap-action switch portion 12 is formed in part by means of the actuating assembly 20, the butterfly assembly 22 and the first terminal means 26. The solid-state switch portion 14 is formed in part by means of the electronic switching means 24 and the second terminal means 28. The outer switch casing 18 is preferably formed of a plastic material and has a generally rectangular configuration.

The first terminal means 26 is operatively mounted within the outer casing 18. The terminal means 26 includes upper terminal members 30, 32, each having upper fixed contacts 34 formed thereon and lower terminal members 36, 38, each having lower fixed contacts 40 formed thereon. Similarly, the second terminal means 28 is operatively mounted within the outer casing 18. The terminal means 28 includes upper terminal members 42, 44 and lower terminal members 46, 48.

The button and spring actuator assembly 20 includes a button member 50 formed preferably of a molded plastic material, an elongated actuating member 52, and a return spring 54. The return spring 54 serves to return the button member 50 and the elongated actuating member 52 to their original at rest positions illustrated in FIG. 1. The button member 50 is adapted to be manually engaged and includes a bottom surface 56 which is fixedly secured to the elongated actuating member 52.

The elongated actuating member 52 has a generally rectangular-shaped configuration and is disposed along the vertical axis of the hybrid switch 10. The actuating member 52 is formed of a top portion 58, a mid-portion 60, and a bottom portion 62. The top portion 58 is adapted to be mounted to or received within the bottom surface 56 of the button member 50. The mid-portion 60 is provided with a light aperture or opening 64 which permits the passage of light therethrough as will be explained more fully hereinafter. The bottom portion 62 fits snugly within one end of the return spring 54 which biases the elongated actuating member 52 and the button member 50 in an upward direction. The other end of the return spring 54 engages a bottom surface defined within the switch casing 18.

The mid-portion 60 further includes V-shaped notch portions 66 which are formed within its opposite faces. These notched portions 66 function as pivot points and as precision locations for the butterfly assembly 22. It should be noted that the notch portions 66 are located between the light aperture 64 and the bottom portion 62.

The actuator assembly 20 mounts the snap switch butterfly assembly 22 and is used to initiate the snap action thereof so as to provide selective switching connections between the opposed upper fixed contacts 30, 32 or the opposed lower fixed contacts 36, 38. Further, the butterfly assembly 22 is also used to simultaneously activate the electronic switching means 24 to provide selective switching connections between the lower terminal member 48 defining an output contact terminal and a ground potential.

The snap switch butterfly assembly 22 includes a pair of identical, movable switch contact blade members 68a, 68b which are analogous to a pair of butterfly "wings." One end of each of the blade members 68a, 68b is provided with an upper movable contact 70 and a lower movable contact 72. A tension spring 74 is passed through an opening (not shown) defined within the actuating member 52 so as to mount the other ends of the blade members 68a, 68b within the opposed V-shaped notch portions 66. The blade members 68a, 68b are adapted to have their upper and lower movable contacts (70, 72) thereon be snapped between the opposed upper fixed contacts 34 mounted upon the respective upper terminal members 30, 32 and the opposed lower fixed contacts 40 mounted upon the respective lower terminal members 36, 38.

The electronic switching means 24 comprises an opto-electronic device formed of a light source and a light-responsive element. The light source is preferably a light-emitting diode (LED) 76 having a first terminal lead 78 connected to its anode and a second terminal lead 80 connected to its cathode. The light-responsive element is preferably a photodetector such as, for example, a phototransistor 82 having a first terminal lead 84 connected to its collector and a second terminal lead 86 connected to its emitter. It will be noted that the light-emitting diode 76 and the phototransistor 82 are mounted within the switch casing 18 so that a light-transmitting window 88 of the LED 76 is diametrically opposed to a light-receiving window 90 of the phototransistor 82. The first and second terminal leads 78 and 80 of the LED are suitably connected to the respective upper and lower terminal members 42 and 46, such as, for example by means of welding or soldering. Similarly, the first and second terminal leads 84 and 86 of the phototransistor are suitably connected to the upper and lower terminal members 44 and 48, respectively.

Referring now to FIGS. 2 and 3, there are shown a schematic diagram and a wiring diagram of how the terminal members of the hybrid switch 10 may be connected to external components so as to perform useful selective switching connections between the various terminal members. As can be seen, a D.C. power source is connected to the upper terminal member 32 of the snap switch portion 12 by means of a line 92. The upper terminal member 30 is connected to the anode of the LED 76 at the upper terminal member 42 of the solid-state switch portion 14 by means of line 93. The upper terminal member 42 is also connected by means of a jumper wire 94 to the upper terminal member 44. The lower terminal member 46, which is connected to the cathode of the LED 76, is further joined to one end of an external current-limiting resistor $R_D$. The other end of the resistor $R_D$ is connected to a ground potential GND. The lower terminal member 48, which is connected to the emitter of the phototransistor 82, is further joined to one end of an external load resistor $R_T$. The other end of the resistor $R_T$ is connected to the other end of the resistor $R_D$.

With reference being made back to FIG. 1, when the switch mechanism is disposed in the rest position the contact blade members 68a, 68b are in bridging engagement between the lower terminal members 36 and 38. Thus, a mechanical circuit connection is completed between the two lower terminal members 36 and 38. Since there is no connection across the upper terminal members 30 and 32, no voltage from the power source will be applied to the anode of the LED 76. Accordingly, no light will be emitted from the light-transmitting window 88. As a result, the phototransistor 82 will be non-conductive so as to present a low or "$\phi$" logic level (uncompleted electronic connection circuit) between the upper terminal member 48 defining the output contact terminal and the ground potential GND.

In operation, the button member 50 of the actuator assembly 20 is depressed so as to cause the elongated actuating member 52 to move downwardly against the bias of the return spring 54. Initially, the butterfly assembly 22 is restrained by means of the opposed lower fixed contacts 40 disposed upon the lower terminal members 36, 38 and will remain in contact therewith until the pivot points 66 pass the center line of the tension spring 74. At that time, the movable contact blade member 68a, 68b are then snapped overcenter so that the upper movable contacts 70 engage the opposed upper fixed contacts 34. Consequently, a mechanical circuit connection is now completed between the upper terminal members 30 and 32. This will now, in turn, cause the voltage from the power source to be applied to the anode of the LED 76. Thus, the LED will be rendered conductive so that light will be emitted from the window 88.

With the actuating member 52 being depressed to a lower vertical position, the light aperture 64 will be aligned horizontally between the windows 88 and 90 so as to permit the light from the light-transmitting window 88 to reach the light-receiving window 90. Therefore, the phototransistor 82 will be turned on and a current will pass through the load resistor $R_T$. A high or "1" logic level (completed electronic circuit connection) will be presented across the output contact terminal 48 and the ground potential GND.

The engagement of the upper terminal members 30 and 32 and the conduction of the phototransistor 82 will continue until the downward pressure upon the button member 50 is released causing the return spring 54 to return the butterfly assembly 22 back to the rest position shown in FIG. 1. As the pivot points 66 upon the actuating member 52 move past the center line of the tension spring 74, the movable contact blade members 68a, 68b will again be snapped overcenter but in the reverse direction. As a result, the lower movable contacts 72 will be engaged with the opposed lower fixed contacts 40. A mechanical circuit connection will again be completed between the lower terminal members 36 and 38. Furthermore, the voltage from the power source will be disconnected from the anode of the LED 76, which turns the same off. Thus, the phototransistor 82 will in turn be rendered non-conductive again so as to present the low logic level between the output contact terminal 48 and the ground potential.

In FIG. 4, there is shown a second embodiment of a hybrid switch 110 which is constructed in accordance with the principles of the present invention. Like reference numerals have been employed throughout corresponding FIGS. 1-3 and FIGS. 4-6 to designate the like parts. The hybrid switch 110 of FIG. 4 is quite similar to the hybrid switch 10 of FIG. 1 and includes a snap-action switch portion 12a and a solid-state switching portion 14a. However, it can be seen that the snap switch portion 12a is located within the upper part of the switching case 18a rather than within the lower part as in FIG. 1. Furthermore, the solid-state switching portion 14a is located within the lower part of the switching casing rather than within the upper part thereof.

The snap switching portion 12a includes an actuator assembly 20a, butterfly assembly 22a and first terminal means 26a. The main difference resides in the actuating member 52a of the actuator assembly 20a wherein the light aperture 64 of FIG. 1 has been eliminated. Since the construction, assembly and operation of the snap switching portion 12a is quite similar to that of the snap switching portion 12 previously described with respect to FIG. 1, this description will not be repeated again.

The solid-state switching portion 14a is comprised of an electronic switching means 24a and second terminal means 28a. The second terminal means 28a includes a pair of opposed terminal members 42a, 44a which are operatively mounted within the outer switch casing 18a. The electronic switching means 24a is formed of a bipolar transistor 82a having its collector connected to a terminal lead 84a, its emitter connected to a terminal lead 86a, and its base connected to a terminal lead 78a. The terminal leads 84a, 86a and 78a are connected to corresponding terminal members 42a, 44a and 38a.

Figure 5:
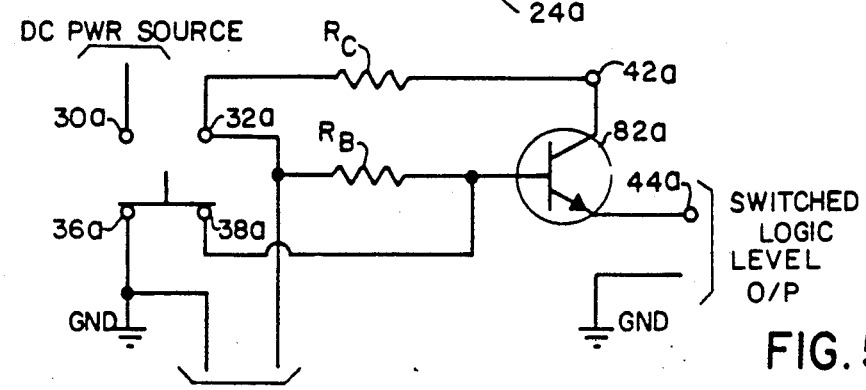
FIG. 5 is a schematic circuit diagram of the hybrid switch of FIG. 4, illustrating its connection to external components during use.
Figure 6:
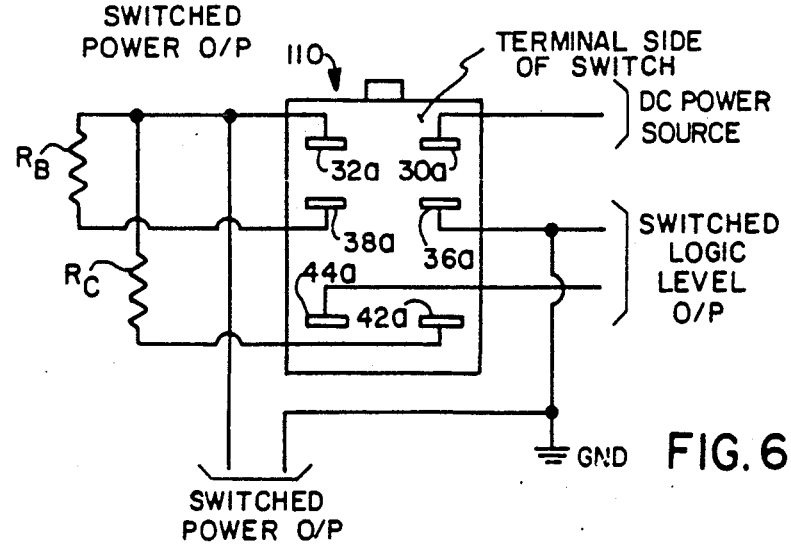
FIG. 6 is a wiring diagram for FIG. 5, illustrating the connection of the terminal contact members of the hybrid switch of FIG. 4 to the external components.

In FIGS. 5 and 6, there are shown a schematic diagram and wiring diagram of how the terminal members of the hybrid switch 110 may be connected to external components so as to perform useful switching connections between the various terminal members. In view of the foregoing description made to FIGS. 2 and 3, it is believed that these schematic and wiring diagrams of FIGS. 5 and 6 are self-explanatory to those skilled in the art. Accordingly, a detailed discussion of the interconnection of the various circuit components and their manner of operation has been purposely omitted.

As should be apparent, when a mechanical circuit connection is completed across the terminal members 32a and 30a, a supply voltage will be applied to the collector of the bipolar transistor 82a by means of a collector resistor $R_C$ and base current will be delivered to the base of the transistor 82a by means of a base resistor $R_B$. Thus, the bipolar transistor will be switched between a non-conductive state and a conductive state so as to present the corresponding low and high logic levels at the terminal member 44a defining an output contact terminal. The mechanical operation of the hybrid switch 110 of FIG. 4 from a user point of view would be substantially similar to the operation of the hybrid switch 10 of FIG. 1.

From the foregoing detailed description, it can thus be seen that the present invention provides a hybrid switch which combines a snap-switch portion having a butterfly-type mechanism and a solid-state switch portion into a single compact housing. The solid-state switch portion includes an electronic switching means formed of a light-emitting diode and a phototransistor. Alteratively, the electronic switching means is comprised of a bipolar transistor.

While there has been illustrated and described what is at present considered to be preferred embodiments of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiments disclosed as the best modes contemplated for carrying out the invention, but that the invention will include all embodiments falling within the scope of the appended claims.

What is claimed is:

1. A compact solid-state/mechanical hybrid switch, comprising:
   housing means;
   actuating means disposed within said housing means for movement between a first position and a second position;
   return spring means disposed within said housing means and operatively connected to said actuating means for returning said actuating means from said second position to said first position when pressure is removed from said actuating means;
   first terminal means disposed within said housing means and including a first pair of oppositely disposed fixed contact members electrically connected within a first electrical circuit, and a second pair of oppositely disposed fixed contact members electrically connected within a second electrical circuit;
   solid-state switching means fixedly disposed within said housing means and disposed within said first electrical circuit for producing selective switching between low and high logic levels at second terminal means disposed within said housing means; and
   switch butterfly assembly means disposed within said housing means and including a pair of oppositely disposed movable switch contact blade members pivotably mounted upon said actuating means for movement between said first pair of oppositely disposed fixed contact members and said second pair of oppositely disposed fixed contact members, in response to said movement of said actuating means between said first position and said second position, for alternatively controlling said first electrical circuit, electrically connected to said first pair of oppositely disposed fixed contact members, and within which said solid-state switching means is incorporated, and said second electrical circuit electrically connected to said second pair of oppositely disposed fixed contact members.

2. A hybrid switch as claimed in claim 1, wherein:
   said oppositely disposed movable switch contact blade members bridge said oppositely disposed first fixed contact members of said first terminal means when said oppositely disposed movable switch contact blade members are disposed at a first position so as to complete said first electrical circuit, and wherein said solid-state switching means causes one of said low and high logic levels to appear at said second terminal means when said oppositely disposed movable switch contact blade members are disposed at said first position.

3. A hybrid switch as claimed in claim 2, wherein:
   said oppositely disposed movable switch contact blade members bridge said oppositely disposed second fixed contact members of said first terminal means when said oppositely disposed movable switch contact blade members are disposed at a second position so as to complete said second electrical circuit, and wherein said solid-state switching means causes the other one of said low and high logic levels to appear at said second terminal means when said oppositely disposed movable switch contact blade members are disposed at said second position.

4. A hybrid switch as claimed in claim 1, wherein said solid-state switching means comprises an opto-electronic means comprising a light source and a light-responsive means.

5. A hybrid switch as claimed in claim 4, wherein said light source comprises a light-emitting diode, and wherein said light-responsive means comprises a phototransistor.

6. A hybrid switch as claimed in claim 5, wherein said light-emitting diode and said phototransistor are provided with terminal leads which are operatively connected to said second terminal means, the emitter of said phototransistor being connected to an output contact terminal of said second terminal means.

7. A hybrid switch as claimed in claim 1, wherein said solid-state switching means comprises a transistor means.

8. A hybrid switch as claimed in claim 7, wherein said transistor means comprises a bipolar transistor.

9. A hybrid switch as claimed in claim 8, wherein said bipolar transistor is provided with terminal leads which are operatively connected to said second terminal means.

10. A compact solid-state/mechanical hybrid switch, comprising:
    housing means;
    actuating means disposed within said housing means for movement between a first position and a second position;
    return spring means disposed within said housing means and operatively connected to said actuating means for returning said actuating means from said second position to said first position when pressure is removed from said actuating means;
    first terminal means disposed within said housing means and including a first pair of oppositely disposed fixed contact members electrically connected within a first electrical circuit, and a second pair of oppositely disposed fixed contact members electrically connected within a second electrical circuit;
    solid-state switching means fixedly disposed within said housing means and disposed within said first electrical circuit for producing selective electronic switching between low and high logic levels at second terminal means disposed within said housing means; and snap-action switching means disposed within said housing means and mounted upon said actuating means for movement between said first pair of oppositely disposed fixed contact members and said second pair of oppositely disposed fixed contact members, in response to said movement of said actuating means between said first position and said second position, for providing selective mechanical switching connections between said first pair of oppositely disposed fixed contact members, and said first electrical circuit controlled thereby and within which said solid-state switching means is incorporated, and said second pair of oppositely disposed fixed contact members and said second electrical circuit controlled thereby.

11. A hybrid switch as claimed in claim 10, wherein said solid-state switching means comprises an opto-electronic means comprising a light source and a light-responsive means.

12. A hybrid switch as claimed in claim 11, wherein said light source comprises a light-emitting diode, and wherein said light-responsive means comprises a phototransistor.

13. A hybrid switch as claimed in claim 12, wherein said light-emitting diode and said phototransistor are provided with terminal leads which are operatively connected to said second terminal means, the emitter of said phototransistor being connected to an output contact terminal of said second terminal means.

14. A hybrid switch as claimed in claim 10, wherein said solid-state switching means comprises a transistor means.

15. A hybrid switch as claimed in claim 14, wherein said transistor means comprises a bipolar transistor.

16. A hybrid switch as claimed in claim 15, wherein said bipolar transistor is provided with terminal leads which are operatively connected to said second terminal means.

17. A compact solid-state/mechanical hybrid switch, comprising:
housing means;
first terminal means disposed within said housing means and including a first pair of oppositely disposed fixed contact members electrically connected within a first electrical circuit, and a second pair of oppositely disposed fixed contact members electrically connected within a second electrical circuit;

solid-state switching means fixedly disposed within said housing means and disposed within said first electrical circuit for producing selective electronic switching between low and high logic levels at second terminal means disposed within said housing means; and snap-action switching means disposed within said housing means and mounted upon said actuating means for movement between said first pair of oppositely disposed fixed contact members and said second pair of oppositely disposed fixed contact members, in response to said movement of said actuating means between said first position and said second position, for providing selective mechanical switching connections between said first pair of oppositely disposed fixed contact members, and said first electrical circuit controlled thereby and within which said solid-state switching means is incorporated, and said second pair of oppositely disposed fixed contact members and said second electrical circuit controlled thereby.

18. A hybrid switch as claimed in claim 17, wherein said solid-state switching means comprises an opto-electronic means comprising a light source and a light-responsive means.

19. A hybrid switch as claimed in claim 18, wherein said light source comprises a light-emitting diode, and wherein said light-responsive means comprises a phototransistor.

20. A hybrid switch as claimed in claim 17, wherein said solid-state switching means comprises a transistor means.

21. A hybrid switch as set forth in claim 4, further comprising:
aperture means defined within said actuating means for permitting transmission of light from said light source to said light-responsive means when said actuating means is disposed at said second position, said light source and said light-responsive means being fixed within said housing means upon opposite sides of said actuating means.

* * * * *